United States Patent [19]

Urano et al.

[11] Patent Number: 5,216,135
[45] Date of Patent: Jun. 1, 1993

[54] DIAZODISULFONES

[75] Inventors: Fumiyoshi Urano, Niiza; Masaaki Nakahata, Kawagoe; Hirotoshi Fujie, Saitama; Keiji Oono, Sakado, all of Japan

[73] Assignee: Wako Pure Chemical Industries, Ltd., Osaka, Japan

[21] Appl. No.: 962,089

[22] Filed: Oct. 16, 1992

Related U.S. Application Data

[63] Continuation of Ser. No. 646,909, Jan. 28, 1991, abandoned.

[30] Foreign Application Priority Data

Jan. 30, 1990 [JP] Japan ................... 2-019614

[51] Int. Cl.$^5$ ............... C07C 245/12; C07C 245/16
[52] U.S. Cl. .................... 534/556; 534/558; 534/565
[58] Field of Search ............ 534/556, 558, 565

[56] References Cited

U.S. PATENT DOCUMENTS

| | | | |
|---|---|---|---|
| 3,332,936 | 7/1967 | Diekmann | 534/556 |
| 4,491,628 | 1/1985 | Ito et al. | 430/176 |
| 4,603,101 | 7/1986 | Crivello | 430/270 |

FOREIGN PATENT DOCUMENTS

| | | |
|---|---|---|
| 2-27660 | 3/1984 | Japan. |
| 62-115440 | 5/1987 | Japan. |
| 1231789 | 5/1987 | United Kingdom. |

OTHER PUBLICATIONS

Chem. Abstract, 68 (13):59304j.
Chemical Abstracts, 60, 19928h (1984).
Chemische Berichte Jahrg., 97, 735 (1964).
Polymer Engineering and Science, Dec. 1983, vol. 23, No. 18, pp. 1012-1018.
SPIE, 920, p. 67 (1988).
Chemische Berichte Jahrg., 99, 1966, vol. 9, No. 5 pp. 1704-1711.
J. Chem. Soc. Perkin Trans. II No. 10 pp. 1273-1278 (1982).
Chemical Abstracts, 114, 33140w (1991).

Primary Examiner—Marianne M. Cintins
Assistant Examiner—John D. Peabody
Attorney, Agent, or Firm—Armstrong, Westerman, Hattori, McLeland & Naughton

[57] ABSTRACT

$$R^1SO_2CSO_2R^2$$
$$\underset{N_2}{\|}$$

wherein $R^1$ is a $C_{3-8}$ branched or cyclic alkyl group, and $R^2$ is a $C_{1-8}$ straight-chain, branched or cyclic alkyl group, is effective as a photoacid generator when used in a photoresist material for light of 300 nm or less.

7 Claims, 2 Drawing Sheets

DIAZODISULFONES

This application is a continuation of application Ser. No. 646,909 filed Jan. 28, 1991 now abandoned.

BACKGROUND OF THE INVENTION

This invention relates to a diazodisulfone compound useful as a photosensitive material for deep ultraviolet (UV) light, electron beams, X-rays, etc. More particularly, the present invention relates to a diazodisulfone compound which generates an acid by irradiating with KrF excimer laser light (248.4 nm), ArF excimer laser light (193 nm), electron beams, X-rays, etc.

With recent higher density and larger scale integration of semiconductor devices, wavelengths used in exposing devices for minute processing, particularly for lithography become shorter and shorter. Now, KrF excimer laser light (248.4 nm) is studied. In order to use the KrF excimer laser as a light source, a resist material is required to act highly sensitively to light exposed.

One method for making the resist material highly sensitive is to contain therein a compound which has a property of generating an acid when exposed to light, that is, to use a so-called chemical amplified resist material [e.g. H. Ito et al: Polym. Eng. Sci., vol. 23, 1012 (1983)]. As the compound generating an acid by exposing to light (hereinafter referred to as "photoacid generator"), there are proposed onium salts such as allyl diazonium salts, diallyl iodonium salts, triallyl sulfonium salts (e.g. U.S. Pat. Nos. 4,491,628 and 4,603,101, Japanese Patent Examined Publication No. 2-27660, Japanese Patent Unexamined Publication No. 62-115440), 2,6-dinitrobenzyl tosylate [e.g. F.M. Houlihan, et al: SPIE, vol. 920, Advances in Resist Technology and Processing V, page 67 (1988)]. But, since these compounds used as the photoacid generator have aromatic rings, there is a problem in that resist materials containing these compounds lower transmittance for light. Further, in the case of onium salts, resist materials containing onium salts have a problem in that the resist materials are poor in solution stability during storage.

Therefore, a resist material overcoming the problem of poor solution stability caused by a property of photoacid generator, and improving transmittance for deep UV light and KrF excimer laser light is desired.

SUMMARY OF THE INVENTION

It is an object of the present invention to provide a diazodisulfone compound used as an photoacid generator overcoming the problems mentioned above, having high transmittance for light of 300 nm or less, e.g. deep UV light, KrF excimer laser light, ArF excimer laser light, generating easily an acid by exposure to the light mentioned above or by irradiation with electron beams, X-rays, etc., being excellent in solution stability in the resist material, and having a function of improving a dissolution inhibiting effect of the resist material for an alkali developing solution.

The present invention provides a diazodisulfone compound of the formula:

(I)

wherein $R^1$ is a branched or cyclic alkyl group having 3 to 8 carbon atoms; and $R^2$ is a straight-chain, branched or cyclic alkyl group having 1 to 8 carbon atoms.

DESCRIPTION OF THE PREFERRED EMBODIMENTS

The diazodisulfone compound of the formula:

(I)

wherein $R^1$ is a branched or cyclic alkyl group having 3 to 8 carbon atoms; and $R^2$ is a straight-chain, branched or cyclic alkyl group having 1 to 8 carbon atoms, has high transmittance for light of 300 nm or less, e.g. deep UV light, KrF excimer laser light, etc., generates an acid easily by exposure to such light or by irradiation with electron beams, X-rays, etc., the acid generated functioning effectively on chemical amplification of the resist material with heating, and is excellent by itself in solution stability in the resist material.

In the formula (I), the alkyl group in the definition of $R^1$ includes, for example, an isopropyl group, an isobutyl group, a sec-butyl group, a tert-butyl group, an isoamyl group, a sec-amyl group, a 2-methylbutyl group, a 2-methyl-2-butyl group, a 1,1-dimethylbutyl group, a 2-hexyl group, a 1,1-dimethylpentyl group, a 1,1-dimethylhexyl group, a cyclopropyl group, a cyclopentyl group, a cyclohexyl group, a cycloheptyl group, a cyclooctyl group, etc. The alkyl group in the definition of $R^2$ includes, for example, a methyl group, an ethyl group, a n-propyl group, an isopropyl group, a cyclopropyl group, a n-butyl group, an isobutyl group, a sec-butyl group, a tert-butyl group, an n-amyl group, an isoamyl group, a sec-amyl group, a 2-methylbutyl group, a 2-methyl-2-butyl group, a cyclopentyl group, a n-hexyl group, a cyclohexyl group, a n-heptyl group, a n-octyl group, etc.

Preferable examples of the diazodisulfones of the formula (I) are as follows.

Bis(cyclohexylsulfonyl)diazomethane
Cyclohexylsulfonylethylsulfonyldiazomethane
Bis(isopropylsulfonyl)diazomethane
Bis(tert-butylsulfonyl)diazomethane
Bis(sec-butylsulfonyl)diazomethane
tert-Butylsulfonylmethylsulfonyldiazomethane
tert-Butylsulfonylcyclohexylsulfonyldiazomethane
Bis(cyclopentylsulfonyl)diazomethane
Cyclopentylsulfonyl-tert-butylsulfonyldiazomethane
Bis(isoamylsulfonyl)diazomethane, etc.

The compound of the formula (I) has a bulky group of a branched or cyclic alkyl group at at least one of $R^1$ and $R^2$, so that it per se has a property of low insolubility in an alkali developing solution. Therefore, a resist material containing such a compound is consequently lowered in solubility in an alkali developing solution, resulting in increasing a dissolution inhibiting effect on so-called non-exposed portions. Such a resist material is more preferable as a pattern forming material.

On the other hand, when both $R^1$ and $R^2$ in the formula (I) have no bulky groups in contrast to the definitions in the present invention, for example, $R^1$ and $R^2$ are ethyl groups, such a compound has a property of generating an acid by exposure to KrF excimer laser light, and also has a property of being dissolved by itself in the alkali developing solution used for pattern formation. Thus, when such a compound is used as an photoacid generator in a chemical amplified resist material and subjected to pattern formation, both exposed portions and non-exposed portions are dissolved in the alkali developing solution, resulting in failing to conduct good pattern formation.

The compound of the formula (I) can be synthesized easily as follows.

For example, when $R^1 = R^2$, the compound of the formula (I) can be synthesized by the following reaction scheme (1):

$$2R^1SH \xrightarrow[\text{base}]{CH_2Cl_2} R^1SCH_2SR^1 \xrightarrow{H_2O_2}$$
(II)                  (III)

This is explained in detail as follows.
The compound of the formula:

$$R^1SH \quad\quad (II)$$

wherein $R^1$ is as defined above, is reacted with methylene chloride in an organic solvent in the presence of a base to yield the compound of the formula:

$$R^1SCH_2SR^1 \quad\quad (III)$$

wherein $R^1$ is as defined above.

As the base, there can be used NaOH, KOH, NaH, sodium methoxide, sodium ethoxide, pyridine, piperidine, morpholine, triethylamine, N-methylpyrrolidine, etc.

As the organic solvent, there can be used alcohols such as methanol, ethanol, propanol, isopropenol, etc.; aromatic hydrocarbons such as benzene, toluene, etc.; cyclic ethers such as 1,4-dioxane, tetrahydrofuran (THF), etc.

Methylene chloride is used usually in an amount of 1 to 20 moles, preferably 5 to 15 moles, per mole of the compound of the formula (I).

The reaction is carried out usually at 20° to 100° C., preferably at 25° to 65° C. for usually 1 to 20 hours, preferably 2 to 10 hours.

The resulting compound of the formula (III) is purified by a conventional method.

The compound of the formula (III) is, then, reacted with hydrogen peroxide in a solvent in the presence of a catalyst to yield the compound of the formula:

$$R^1SO_2CH_2SO_2R^1 \quad\quad (IV)$$

wherein $R^1$ is as defined above.

The hydrogen peroxide is used usually in an amount of 1 to 10 moles, preferably 2 to 6 moles, per mole of the compound of the formula (III).

As the catalyst, there can be used sodium tungstate, ammonium phosphomolibdate, etc.

As the solvent, there can be used water; alcohols such as methanol, ethanol, propanol, isopropanol, etc.; a mixed solvent of water and an alcohol, etc.

The reaction is carried out usually at 0° to 100° C., preferably at 20° to 80° C., for usually 1 to 20 hours, preferably 1 to 10 hours.

The resulting compound of the formula (IV) is purified by a conventional method.

Then, the compound of the formula (IV) is reacted with tosyl azide in a solvent in the presence of a base to yield the compound of the formula:

$$\begin{array}{c} R^1SO_2CSO_2R^1 \\ \| \\ N_2 \end{array} \quad\quad (V)$$

wherein $R^1$ is as defined above.

The tosyl azide is used usually in an amount of 0.5 to 5 moles, preferably 0.5 to 2 moles, per mole of the compound of the formula (IV).

As the base, there can be used NaOH, KOH, NaH, sodium methoxide, sodium ethoxide, pyridine, piperidine, morpholine, triethylamine, N-methylpyrrolidine, etc.

As the solvent, there can be used water; water-soluble organic solvents such as methanol, ethanol, propanol, isopropanol, acetone, 1,4-dioxane, etc.; and a mixed solvent of water and a water-soluble organic solvent.

The reaction is carried out usually at 0° to 50° C., preferably at 5° to 30° C., for usually 1 to 20 hours, preferably 1 to 10 hours.

The resulting compound of the formula (V) is purified by a conventional method.

When $R^1$ and $R^2$ are different, the compound of the formula (I) can be synthesized easily by the following reaction scheme (2):

This is explained in detail as follows.

The compound of the formula (II) in an amount of 1 mole is mixed with usually 0.5 to 10 moles, preferably 0.5 to 2 moles of paraformaldehyde (e.g. n=3), followed by introduction of HCl gas in an amount of equimolar or mole of the paraformaldehyde at usually 10° C. or lower, preferably −10° to +5° C. Then, anhydrous calcium chloride is added to the resulting mixture to carry out the reaction at usually 10° C. or lower, preferably −10° to +5° C., for usually 1 to 20 hours, preferably 1 to 10 hours, followed by purification by a conventional method to yield the compound of the formula:

$$R^1SCH_2Cl \quad (VI)$$

wherein $R^1$ is as defined above.

The compound of the formula (VI) is then reacted with the compound of the formula:

$$R^2SH \quad (VII)$$

wherein $R^2$ is as defined above but different from $R^1$, in a solvent in the presence of a base to yield the compound of the formula:

$$R^1SCH_2SR^2 \quad (VIII)$$

The compound of the formula (VI) is used in an amount of usually 0.5 to 5 moles, preferably 0.5 to 2 moles, per mole of the compound of the formula As the base, there can be used NaOH, KOH, NaH, sodium methoxide, sodium ethoxide, etc.

As the solvent, there can be used alcohols such as methanol, ethanol, isopropanol, etc.

The reaction is carried out usually at 0° to 50° C., preferably at 0° to 20° C., for usually 1 to 20 hours, preferably 1 to 10 hours.

The resulting compound of the formula (VIII) is purified by a conventional method.

The compound of the formula (VIII) is oxidized with hydrogen peroxide, followed by diazotization with tosylazide, in the same manner as described in the reaction scheme (1) to yield the compound of the formula (I).

The compound of the formula (VIII) can also be synthesized by the following reaction scheme (3):

This is explained in detail as follows.

The compound of the formula (II) is reacted with the compound of the formula (VII) and methylene chloride in a solvent in the presence of a base to yield the compound of the formula (VIII).

The compound of the formula (VII) is used usually in an amount of 0.5 to 5 moles, preferably 0.5 to 2 moles, per mole of the compound of the formula (II), and methylene chloride is used usually in an amount of 1 to 20 moles, preferably 5 to 15 moles, per mole of the compound of the formula (II).

As the base, there can be used NaOH, KOH, NaH, sodium methxoide, sodium ethoxide, pyridine, piperidine, morpholine, triethylamine, N-methylpyrrolidine, etc.

As the solvent, there can be used alcohols such as methanol, ethanol, propanol, isopropanol, etc.; aromatic hydrocarbons such as benzene, toluene, etc.; cyclic ethers such as 1,4-dioxane, tetrahydrofuran, etc.

The reaction is carried out usually at 20° to 100° C., preferably 25° to 65° C. for usually 1 to 20 hours, preferably 2 to 10 hours.

The resulting product is purified by a conventional method such as distillation, column chromatography, etc. to yield the compound of the formula (VIII).

The compound of the formula (VIII) is converted to the compound of the formula (I) in the same manner as described in the reaction scheme (2).

When $R^1$ and $R^2$ are different, the reaction scheme (2) is preferable from the viewpoint of practical production.

The compound of the formula (I) is effectively used in a chemical amplified resist material wherein there is used a polymer having a property of alkali-soluble by the action of an acid. When the resist material is exposed to KrF excimer laser light or the like, the compound of the formula (I) present in the exposed portion generates an acid by the following reaction scheme (4):

When heat treatment is applied after the exposure step, functional groups of the polymer in the resist material is subjected to a chemical change by the acid to become alkali-soluble by the following reaction scheme (5):

The resulting alkali-soluble polymer is released into an alkali developing solution at the time of development.

On the other hand, since non-exposed portions do not generate an acid, no chemical change takes place even if heat treated to produce no alkali-soluble groups. Further, since the compound of the formula (I) has a dissolution inhibiting effect, the non-exposed portions become difficultly soluble in the alkali developing solution.

As mentioned above, when pattern formation is carried out by using a chemical amplified resist material containing the compound of the formula (I), a large difference in solubility in the alkali developing solution takes place between the exposed portions and the non-exposed portions. As a result, there can be formed a positive tone pattern having good contrast. Further, as is clear from the reaction scheme (5), since the acid generated by exposure to light acts catalytically, not only the necessary amount of acid can be produced by the exposure to light, but also the light exposure energy amount can be reduced.

Needless to say, the compound of the formula (I) is useful for producing semiconductors and can be used as a photosensitive reagent in the field of applying photo reaction such as photograving, printing plate materials, etc.

The present invention is illustrated by way of the following Examples.

REFERENCE EXAMPLE 1

(1) Free radical polymerization of p-tert-butoxystyrene

A solution of p-tert-butoxystyrene (17.6 g) in toluene containing catalytic amount of 2,2'-azobisisobutyronitrile (AIBN) was heated at 80° C. for 6 hours under nitrogen. After cooling, the reaction mixture was poured into methanol and the polymer was precipitated. The polymer was filtered, washed with methanol and dried under reduced pressure to afford 15.5 g of poly(p-tert-butoxystyrene) as white powders.

(2) Synthesis of poly(p-tert-butoxystyrene-p-hydroxystyrene)

A solution of poly(p-tert-butoxystyrene) (15.0 g) obtained in above (1) and hydrochloric acid (10 ml) in 1,4-dioxane was refluxed for 1.5 hours with stirring. The mixture was cooled, poured into water and the white solid was precipitated. The polymer was filtered, washed and dried under reduced pressure to afford 11.8 g of the title compound as white powders having $\overline{Mw}$10000 (GPC with polystyrene calibration). The composition of the polymer was found to be p-tert-butoxystyrene and p-hydroxystyrene in a molar ratio of ca 1:1 based on $^1$HNMR analysis

REFERENCE EXAMPLE 2

Synthesis of p-toluenesulfonylazide

After dissolving sodium azide (22.5 g, 0.35 mole) in a small amount of $H_2O$, the resulting solution was diluted with a 90% ethanol aqueous solution (130 ml). To this, an ethanol solution dissolving p-toluenesulfonyl chloride (60 g, 0.32 mole) was added dropwise at 10–25° C., followed by reaction at room temperature for 2.5 hours. The reaction solution was concentrated at room temperature under reduced pressure. The resulting oily residue was washed with $H_2O$ several times and dried over anhydrous $MgSO_4$. After removing the drying agent by filtration, there was obtained 50.7 g of the title compound as a colorless oil.

$^1$HNMR δ ppm (CDCl$_3$): 2.43 (3H, s, $\underline{CH}_3$), 7.24 (2H, d, J=8Hz, Ar 3-H, 5-H), 7.67 (2H, d, J=8Hz, Ar 2-H, 6-H).

IR (Neat) νcm$^{-1}$: 2120 (—N$_3$).

EXAMPLE 1

Synthesis of bis(cyclohexylsulfonyl)diazomethane (1) Synthesis of bis(cyclohexylsulfonyl)methane To cyclohexylthiol (20.2 g, 0.17 mole), an ethanol solution dissolving potassium hydroxide (12.0 g, 0.21 mole) was added dropwise at room temperature and mixture was stirred at 30°±5° C. for 30 minutes. Then methylene chloride (18.2 g, 2.14 mole) was added to this mixture and reacted with stirring at 50°±5° C. for 6 hours. After standing at room temperature overnight, the reaction mixture was diluted with ethanol (55 ml) and added with sodium tungstate (0.4 g). Then, 30% hydrogen peroxide (50 g, 0.44 mole) was added dropwise to this solution at 45°–50° C., reacted with stirring for 4 hours at the same temperature, then added with $H_2O$ (200 ml) and standed overnight at room temperature. The precipitate was filtered, washed with $H_2O$ and dried. The resultant solid was recrystallized from ethanol to give 15.5 g of bis(cyclohexylsulfonyl)methane as white needles.

mp. 137°–139° C.

$^1$HNMR δ ppm (CDCl$_3$) 1.13-2.24 (20H, m, cyclohexylic $\underline{CH}_2 \times 10$), 3.52-3.66 (2H, m, cyclohexylic $\underline{CH} \times 2$), 4.39 (2H, s, $\underline{CH}_2$).

IR (KBr-disk) ν cm$^{-1}$: 1320, 1305.

(2) Synthesis of bis(cyclohexylsulfonyl)diazomethane

To a solution of sodium hydroxide (1.7 g) in a 60% ethanol aqueous solution (70 ml), bis(cyclohexylsulfonyl)methane (12.1 g, 0.04 mole) obtained in above (1) was added, then an ethanol solution of p-toluenesulfonyl azide (8.2 g, 0.04 mole) obtained in Reference Example 2 was added dropwise at 5°–10° C., followed by the reaction at room temperature for 7 hours. After standing at room temperature overnight, the precipitate was filtered, washed with ethanol and dried. The resultant solid was recrystallized from acetonitrile to give 8.0 g of bis(cyclohexylsulfonyl)diazomethane as pale yellow prisms.

mp. 130°–131° C.

$^1$HNMR δ ppm (CDCl$_3$): 1.13-2.25 (20H, m, cyclohexylic $\underline{CH}_2 \times 10$), 3.36-3.52 (2H, m, cyclohexylic $\underline{CH}_2$).

IR (KBr-disk) ν cm$^{-1}$: 2130 (CN$_2$), 1340, 1320.

Figure 1:
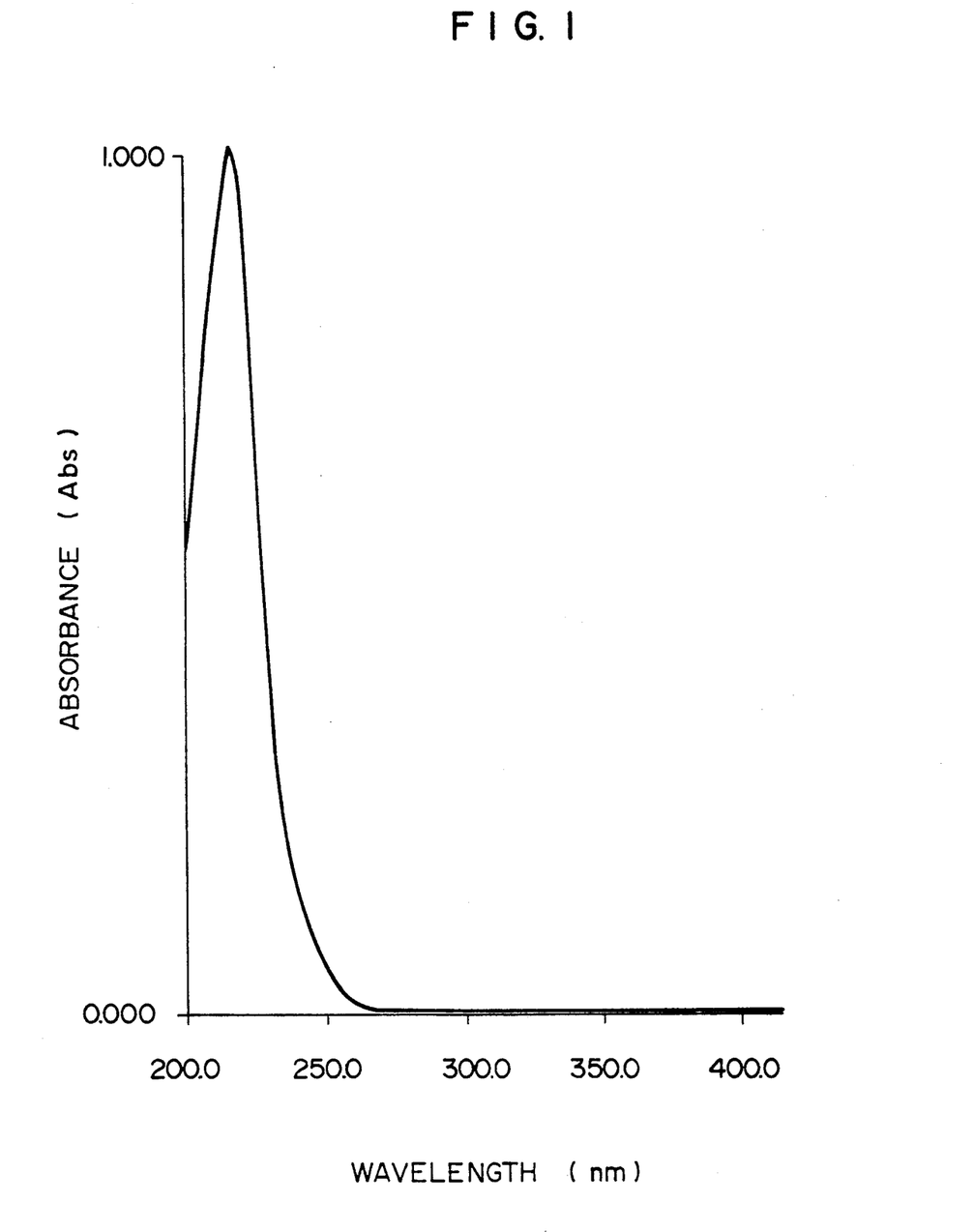
FIG. 1 is a graph showing a UV spectral curve of an acetonitrile solution of bis-cyclohexylsulfonyl diazomethane obtained in Example 1.

Ultraviolet spectrophotometric characteristics of bis(cyclohexylsulfonyl)diazomethane in acetonitrile solution was shown in FIG. 1. It is clear that bis(cyclohexylsulfonyl)diazomethane of the present invention shows good transmittance between 240 and 300 nm.

EXAMPLE 2

Synthesis of cyclohexylsulfonylethylsulfonyldiazomethane (1) Synthesis of chloromethyl cyclohexylsulfide To a mixture of cyclohexylthiol (20.2 g, 0.17 mole) and 80% paraformaldehyde (6.5 g, 0.17 mole), dry hydrogen chloride was introduced at −8°−0° C., then anhydrous calcium chloride was added and stirring was violently continued at 0° C. for 3 hours. After removing the precipitate by filtration, the filtrate was distilled under reduced pressure to afford 16.5 g of chloromethylcyclohexylsulfide as a colorless oil having a boiling point of 100°–103° C./14 mmHg.

(2) Synthesis of cyclohexylsulfonylethylsulfonylmethane

To ethanethiol (5.7 g, 0.09 mole), an ethanol solution dissolving potassium hydroxide (6 g, 0.09 mole) was added dropwise at room temperature and mixture was stirred for 15 minutes. Then chroromethylcyclohexylsulfide (15 g, 0.09 mole) obtained in above (1) was added dropwise to this mixture at 10°±5° C. and reacted with stirring at that temperature for 3 hours. After standing at room temperature overnight, the reaction mixture was diluted with ethanol (30 ml) and $H_2O$ (30 ml) and added with sodium tungstate (0.3 g). Then, 30% hydrogen peroxide (53 g, 0.47 mole) was added dropwise to this solution at 45°–50° C., followed by reaction for 6 hours at the same temperature, then added with $H_2O$ (300 ml) and standed overnight at room temperature. The precipitate was filtered, washed with $H_2O$ and dried. The resultant solid (19 g) was recrystallized from ethanol to give 15.5 g of cyclohexylsulfonylethylsulfonylmethane as white needles.

mp.: 89°–91° C.

$^1$HNMR δ ppm ($CDCl_3$): 1.13–2.24 (13H, m, cyclohexylic $CH_2 \times 5$ and $CH_2CH_3$), 3.44 (2H, q, J=7.3Hz, $C\underline{H}_2CH_3$), 3.53–3.68 (1H, m, cyclohexylic CH), 4.40 (2$\overline{H}$, s, $CH_2$).

IR (KBr-disk) ν cm$^{-1}$: 1315.

(3) Synthesis of cyclohexylsulfonyl ethylsulfonyldiazomethane

To a solution of sodium hydroxide (1.7 g) in a 60% ethanol aqueous solution (70 ml), cyclohexylsulfonylethylsulfonylmethane (10.2 g, 0.04 mole) obtained in above (2) was added. Then an ethanol solution of p-toluenesulfonyl azide (8.2 g, 0.04 mole) obtained in Reference Example 2 was added dropwise at 5°–10° C., followed by reaction at room temperature for 7 hours. After standing at room temperature overnight, the reaction mixture was extracted with ethyl acetate (25 ml ×3), the organic layer was separated, washed with $H_2O$ and dried over anhydrous $MgSO_4$. After removing the drying agent by filtration, the solvent was evaporated in vacuo, the resultant residue (12 g) was subjected to column separation [silica gel, Wakogel C-200, a trade name, manufactured by wako Pure Chemical Industries, Ltd.; eluent, n-hexane/ethyl acetate/methylene cloride=8/1/0 → 7/1/1(v/v)]to give 4.1 g of cyclohexylsulfonylethylsulfonyldiazomethane as pale yellow crystals.

m.p.: 85°–86.5° C.

$^1$HNMR δ ppm ($CDCl_3$): 1.13–2.27 (13H, m, cyclohexylic $CH_2 \times 5$ and $CH_2CH_3$), 3.38–3.54 (3H, m, cyclohexylic $\overline{CH}$ and $C\underline{H}_2CH_3$).

IR (KBr-disk) ν cm$^{-1}$: 2120 ($CN_2$), 1325.

EXAMPLES 3–5

Using various thiol compounds of the formula (II) as a starting material, the syntheses were carried out in the same manner as described in Example 1 to give the corresponding bis(alkylsulfonyl)diazomethane. The results are summarized in Table 1.

TABLE 1

| Example | R1 | Appearance (purification) | m.p. | $^1$HNMR δ ppm ($CDCl_3$) | IR (KBr) |
|---|---|---|---|---|---|
| 3 | $CH_3$<br>\<br>   CH—<br>/<br>$CH_3$ | pale yellow needles (recrystallization from methanol) | 82~84° C. | 1.46(12H, d, J=7Hz,<br>$C\underline{H}_3$<br>\<br>   CH— × 2)<br>/<br>$C\underline{H}_3$ | 2120 cm$^{-1}$ |
|  |  |  |  | 3.74(2H, m, J=7Hz,<br>$CH_3$<br>\<br>   C$\underline{H}$— × 2)<br>/<br>$CH_3$ | 1340 cm$^{-1}$<br>1320 cm$^{-1}$ |
| 4 | $CH_3$<br>  \|<br>$CH_3$—C—<br>  \|<br>$CH_3$ | pale yellow needles (recrystallization from ethanol) | 121~121.5° C. | 1.52(18H, s, $C\underline{H}_3 \times 6$) | 2120 cm$^{-1}$<br>1330 cm$^{-1}$<br>1315 cm$^{-1}$ |
| 5 | $CH_3$<br>\<br>   CHCH$_2$—<br>/<br>$CH_3$ | pale yellow oil (column separation: silica gel, wako Gel C-200; eluent, n-hexane/ethyl acetate = 20/1) | — | 1.14(12H, d, J=7Hz,<br>        $C\underline{H}_3$<br>       /<br>—$CH_2CH$  × 2)<br>       \<br>        $C\underline{H}_3$ | 2120 cm$^{-1}$ |
|  |  |  |  | 2.37(2H, m,<br>        $CH_3$<br>       /<br>—$CH_2C\underline{H}$  × 2)<br>       \<br>        $CH_3$ |  |
|  |  |  |  | 3.38(4H, d, J=7Hz,<br>          /<br>—$SO_2C\underline{H}_2CH$  × 2)<br>          \ | 1350 cm$^{-1}$<br>1330 cm$^{-1}$ |

EXAMPLE 6 and 7

Using various thiol compounds of the formula (II) and of the formula (VII) severally as a starting material, the syntheses were carried out in the same manner as described in Example 2 to give the corresponding diazomethane derivatives. The results are summarized in Table 2.

COMPARATIVE EXAMPLE 4

Synthesis of bis(methylsulfonyl)diazomethane (1) Synthesis of bis(methylsulfonyl)methane To a solution of methyl methylsulfinylmethylsulfide (7.0 g, 0.06 mole) and sodium tungstate (0.14 g) in methanol (40 ml) and $H_2O$ (4 ml), 30% hydrogen peroxide (21 g, 0.19 mole) was added dropwise at 45°–50° C., then reacted with stirring under reflux for 8 hours and standed at room temperature overnight. The reaction solution was poured into $H_2O$ (400 ml), and the precipitate was filtered, washed with $H_2O$ and dried. The resultant solid (9.5 g) was recrystallized from ethanol to afford 7.8 g of bis(methylsulfonyl)methane as white leaflets.

m.p.: 148°–149.5° C.

$^1$HNMR δ ppm (CDCl$_3$): 3.26 (6H, s, C$\underline{H}_3$×2), 4.43 (2H, s, C$\underline{H}_2$)

IR (KBr-disk) ν cm$^{-1}$: 1310.

TABLE 2

| Example | R1 | R2 | Appearance (purification) | m.p. | $^1$HNMR δ ppm (CDCl$_3$) | IR (Kbr) |
|---|---|---|---|---|---|---|
| 6 | (CH$_3$)$_3$C— | CH$_3$— | pale yellow needles (recrystallization from ethanol) | 90.5~92° C. | 1.51(9H, s, —C(C$\underline{H}_3$)$_3$) <br> 3.39(3H, s, —SO$_2$C$\underline{H}_3$) | 2120 cm$^{-1}$ <br> 1335 cm$^{-1}$ <br> 1310 cm$^{-1}$ |
| 7 | (CH$_3$)$_3$C— | cyclohexyl | pale yellow needles (recrystallization from n-hexane/ ethyl ether) | 86~88° C. | 1.13–2.27(19H, m, cyclohexyl-H and —C(C$\underline{H}_3$)$_3$) <br><br> 3.47–3.63(1H, m, cyclohexyl C$\underline{H}$) | 2120 cm$^{-1}$ <br><br><br><br> 1330 cm$^{-1}$ <br> 1315 cm$^{-1}$ |

COMPARATIVE EXAMPLES 1–3

Using various thiol compounds having a straight-chain alkyl group as a starting material, the syntheses were carried out in the same manner as described in Example 1 to afford the corresponding bis(alkylsulfonyl)diazomethane. The results are summarized in Table 3.

TABLE 3

$$R-SO_2-\underset{\underset{N_2}{\|}}{C}-SO_2-R$$

| Comparative Example | R | Appearance (purification) | m.p. | $^1$HNMR δ ppm (CDCl$_3$) | IR |
|---|---|---|---|---|---|
| 1 | C$_2$H$_5$— | pale yellow needles (recrystallization from methanol) | 88.7~89.7° C. | 1.46(6H, t, J=7.3Hz, —CH$_2$C$\underline{H}_3$ × 2) <br> 3.48(4H, q, J=7.3Hz, —C$\underline{H}_2$CH$_3$ × 2) | 2140 cm$^{-1}$ <br><br> 1335 cm$^{-1}$ |
| 2 | CH$_3$(CH$_2$)$_3$— | pale yellow needles (column separation: silica gel, Wakogel C-200; eluent, n-hexane/ ethyl acetate = 20/1) | 44~47° C. | 0.98(6H, t, J=7Hz, —C$\underline{H}_3$ × 2) <br> 1.42–1.56(4H, m, —C$\underline{H}_2$CH$_3$ × 2) <br> 1.79–1.90(4H, —SO$_2$CH$_2$C$\underline{H}_2$ × 2) <br> 3.38(4H, d, J=7Hz, —SO$_2$C$\underline{H}_2$CH$_2$— × 2) | 2145 cm$^{-1}$ <br><br><br><br> 1350 cm$^{-1}$ <br><br> 1335 cm$^{-1}$ |
| 3 | CH$_3$(CH$_2$)$_7$— | pale yellow oil (column separation: silica gel, Wakogel C-200; eluent, n-hexane/ ethyl acetate = 3/1) | — | 0.82–1.94(30H, m CH$_3$(C$\underline{H}_2$)$_6$— × 2) <br> 3.43(4H, t, —SO$_2$C$\underline{H}_2$— × 2) | 2120 cm$^{-1}$ <br><br> 1340 cm$^{-1}$ |

(2) Synthesis of bis(methylsulfonyl)diazomethane

Using bis(methylsulfonyl)methane (7.5 g, 0.04 mole) obtained in above (1), the reaction was carried out in the same manner as described in Example 1, (2), and the crude solid (4.5 g) was chromatographed on silica gel (Wakogel C-200) with n-hexane/ethyl acetate (8/1 → 4/1 → 3/1) as eluent to give 2.5 g of bis(methylsulfonyl)diazomethane as white crystals.

m.p.: 120°–124° C.
$^1$HNMR δ ppm (CDCl$_3$): 3.37 (6H, s, CH$_3$×2).
IR (KBr-disk) ν cm$^{-1}$: 2145 (CN$_2$), 1335, 1320.

APPLICATION EXAMPLE 1

A resist material having the following composition was prepared:

| | |
|---|---|
| Poly(p-tert-butoxystyrene-p-hydroxystyrene) [Polymer obtained in Reference Example 1, (2)] | 6.0 g |
| Bis(cyclohexylsulfonyl)diazomethane [Photoacid generator obtained in Example 1, (2)] | 0.3 g |
| Diethylene glycol dimethyl ether | 13.7 g |

Figure 2A:
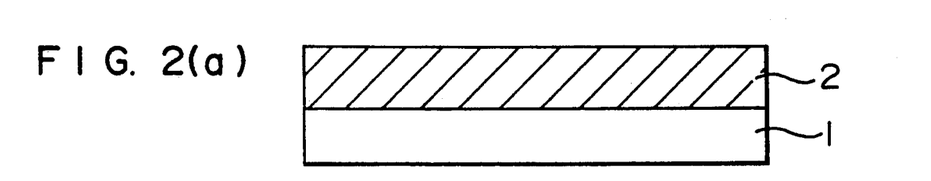
FIGS. 2(a) to 2(c) are schematic cross-sectional views explaining a positive tone pattern forming process using a resist material containing the compound of the present invention as an photoacid generator.
Figure 2B:
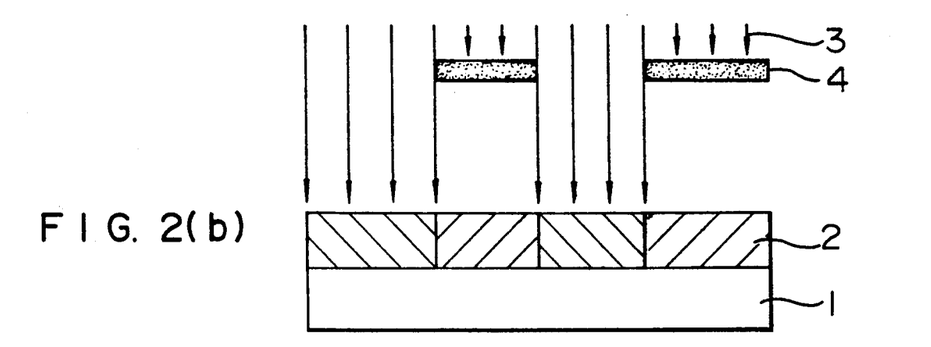
Figure 2C:
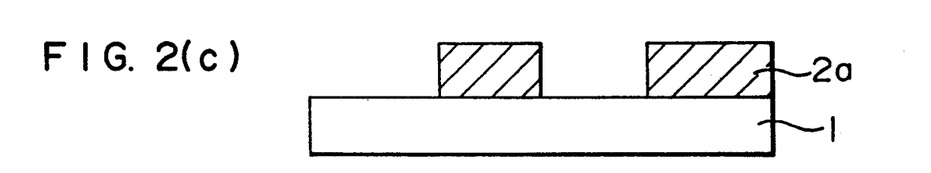

Using the resist material, a pattern was formed as shown in FIG. 2. That is, the resist material was spin coated on a substrate 1 such as a 6 inch silicon wafer in diameter and prebaked by a hot plate at 90° C. for 90 seconds to give a resist material film 2 of 1.0 μm thick [FIG. 2 (a)]. The film 2 was selectively exposed to KrF excimer laser light 3 of 248.4 nm via a mask 4 at a dose of 25 mJ/cm$^2$ using a projection aligner (5:1 reduction, NA=0.42) [FIG. 2 (b)]. The exposed film was heated at 110° C. for 90 seconds, then development was carried out using a conventional alkali aqueous solution (2.38% tetramethylammonium hydroxide aqueous solution) for 60 seconds to remove exposed regions of the film 2 by dissolution to give a positive pattern 2a without loss of film thickness in the unexposed regions [FIG. 2(c)]. The positive pattern had an aspect ratio of ca. 87 degree and 0.3 μm lines and spaces were resolved.

APPLICATION EXAMPLES 2 to 7

Resist materials were prepared in the same manner as described in Application Example 1 except for using the diazodisulfone compounds obtained in Examples 2 to 7 as the photoacid generator. Patterns were formed on semiconductor substrates in the same manner as described in Application Example 1. The results are shown in Table 4.

TABLE 4

| Application Example No. | Photoacid generator | Exposure energy amount (mJ/cm$^2$) | Resolution (μm L/S) |
|---|---|---|---|
| 2 | Example 3 | 25 | 0.3 |
| 3 | Example 4 | 25 | 0.3 |
| 4 | Example 5 | 30 | 0.3 |
| 5 | Example 2 | 30 | 0.3 |
| 6 | Example 6 | 30 | 0.3 |
| 7 | Example 7 | 25 | 0.3 |

As is clear from Table 4, good positive tone patterns are formed by using the resist materials containing the compound of the formula (I) as the photoacid generator.

REFERENCE EXAMPLES 3 to 6

Resist materials were prepared in the same manner as described in Application Example 1 except for using the bis(straight-chain alkylsulfonyl)diazomethanes obtained in Comparative Examples 1 to 4. Using the resist materials, patterns were tried to form on semiconductor substrates in the same manner as described in Application Example 1, but no positive tone patterns were formed, since non-exposed portions were dissolved at the time of development.

These results show that the compounds of the formula (I) of the present invention obtained by introducing a bulky alkyl group into at least one of R$^1$ and R$^2$ moieties of the formula (I) play an important role to exhibit dissolution inhibiting effect for the alkali developing solution.

As mentioned above, when the photosensitive resist materials containing the diazodisulfone compounds of the formula (I) of the present invention are used for a light source of 300 nm or less such as deep UV light, KrF excimer laser light (248.4 nm), etc., fine patterns with good shapes of submicron order can easily be obtained.

The compound of the formula (I) of the present invention exhibits remarkable effects as the photoacid generator when exposed to not only deep UV light, KrF excimer laser light, but also ArF excimer laser light, electron beams, and X-rays.

What is claimed is:

1. A diazodisulfone compound of the formula:

wherein R$^1$ is a branched or cyclic alkyl group having 3 to 8 carbon atoms; and R$^2$ is a straight-chain, branched or cyclic alkyl group having 1 to 8 carbon atoms.

2. A diazodisulfone compound according to claim 1, wherein R$^1$ is a cyclopentyl group, a cyclohexyl group, an isopropyl group, a sec-butyl group, a tert-butyl group or an isoamyl group; and R$^2$ is a methyl group, an ethyl group, a cyclopentyl group, a cyclohexyl group, an isopropyl group, a sec-butyl group, a tert-butyl group or an isoamyl group.

3. A diazodisulfone compound according to claim 1, which is bis(cyclohexylsulfonyl)diazomethane,
cyclohexylsulfonylethylsulfonyldiazomethane,
bis(isopropylsulfonyl)diazomethane,
bis(tert-butylsulfonyl)diazomethane,
bis(sec-butylsulfonyl)diazomethane,
tert-butylsulfonylmethylsulfonyldiazomethane,
tert-butylsulfonylcyclohexylsulfonyldiazomethane,
bis(cyclopentylsulfonyl)diazomethane,
cyclopentylsulfonyl-tert-butylsulfonyldiazomethane, or
bis(isoamylsulfonyl)diazomethane.

4. A diazodisulfone compound of the formula:

wherein R$^1$ is a branched or cyclic alkyl group having 3 to 8 carbon atoms; and R$^2$ is a branched or cyclic alkyl group having 3 to 8 carbon atoms.

5. A compound according to claim 4, wherein $R^1$ is a branched alkyl group having 3 to 8 carbon atoms; and $R^2$ is a branched alkyl group having 3 to 8 carbon atoms.

6. A compound according to claim 4, wherein $R^1$ is a cyclic alkyl group having 3 to 8 carbon atoms; and $R^2$ is a cyclic alkyl group having 3 to 8 carbon atoms.

7. A compound according to claim 4, wherein $R^1$ is a branched alkyl group having 3 to 8 carbon atoms; and $R^2$ is a cyclic alkyl group having 3 to 8 carbon atoms.

* * * * *